(12) United States Patent
Beppu et al.

(10) Patent No.: US 12,009,786 B2
(45) Date of Patent: Jun. 11, 2024

(54) CIRCUIT DEVICE, OSCILLATOR, AND MANUFACTURING METHOD

(71) Applicant: SEIKO EPSON CORPORATION, Tokyo (JP)

(72) Inventors: Kohei Beppu, Saitama (JP); Takehiro Yamamoto, Matsumoto (JP)

(73) Assignee: SEIKO EPSON CORPORATION (JP)

( * ) Notice: Subject to any disclaimer, the term of this patent is extended or adjusted under 35 U.S.C. 154(b) by 0 days.

(21) Appl. No.: 18/087,056

(22) Filed: Dec. 22, 2022

(65) Prior Publication Data

US 2023/0208358 A1 Jun. 29, 2023

(30) Foreign Application Priority Data

Dec. 27, 2021 (JP) ................................. 2021-211998

(51) Int. Cl.
| | |
|---|---|
| H03B 5/36 | (2006.01) |
| H03B 5/04 | (2006.01) |
| H03B 5/32 | (2006.01) |
| H03H 9/05 | (2006.01) |
| H03H 9/10 | (2006.01) |

(52) U.S. Cl.
CPC .............. *H03B 5/36* (2013.01); *H03B 5/04* (2013.01); *H03B 5/32* (2013.01); *H03H 9/0547* (2013.01); *H03H 9/0552* (2013.01); *H03H 9/1021* (2013.01); *H03B 2200/0088* (2013.01)

(58) Field of Classification Search
CPC .... H03B 5/36; H03B 5/04; H03B 2200/0088; H03B 5/32; H03H 9/0547; H03H 9/0552; H03H 9/1021
USPC ......................................... 331/175, 111, 143
See application file for complete search history.

(56) References Cited

U.S. PATENT DOCUMENTS 5,844,446 A * 12/1998 McAllister ................ H03L 1/00
331/74

FOREIGN PATENT DOCUMENTS

JP          H07-297641 A       11/1995

* cited by examiner

*Primary Examiner* — Arnold M Kinkead
(74) *Attorney, Agent, or Firm* — Harness, Dickey & Pierce, P.L.C.

(57) ABSTRACT

A circuit device includes a waveform-shaping circuit that waveform-shapes an oscillation signal and provides an output clock signal based on a clock signal. A bias voltage output circuit of the circuit device provides a bias voltage of the oscillation signal that is input to the waveform-shaping circuit. A comparator of the circuit device compares a DC voltage obtained by smoothing the clock signal with a reference voltage. A logic circuit of the circuit device sets an adjustment value of the bias voltage. In a test mode of the logic circuit, the logic circuit changes the adjustment value to determine a set value of the adjustment value based on output of the comparator when the adjustment value is changed and stores the determined set value in a storage circuit.

9 Claims, 10 Drawing Sheets

CIRCUIT DEVICE, OSCILLATOR, AND MANUFACTURING METHOD

The present application is based on, and claims priority from JP Application Serial Number 2021-211998, filed Dec. 27, 2021, the disclosure of which is hereby incorporated by reference herein in its entirety.

BACKGROUND

1. Technical Field

The present disclosure relates to a circuit device, an oscillator, and a manufacturing method.

2. Related Art

In a circuit device that outputs a clock signal based on an oscillation signal, a sine wave oscillation signal is waveform-shaped to output a square wave clock signal. In this case, there is a required specification for a duty ratio of the clock signal. When a clock signal that does not satisfy the required specification is output, a malfunction or the like of a digital circuit in a subsequent stage is caused. For example, in an oscillator of JP-A-07-297641 (Patent Literature 1), a square wave clock signal is smoothed by a low-pass filter. Then, a DC voltage component of an oscillation signal is changed by a feedback circuit so that a DC voltage obtained by smoothing coincides with a constant voltage, and thus a clock signal having a constant duty ratio is output.

However, in the related art, a signal based on the clock signal is fed back to an input-side amplifier during normal operation in which the oscillator outputs the clock signal. Therefore, noise wraparound occurs due to this feedback path, and noise characteristics of the clock signal deteriorate.

SUMMARY

An aspect of the present disclosure relates to a circuit device. The circuit device includes: an output circuit including a waveform-shaping circuit configured to waveform-shape an oscillation signal, and configured to output an output clock signal based on a clock signal subjected to the waveform-shaping by the waveform-shaping circuit; a bias voltage output circuit configured to output a bias voltage of the oscillation signal input to the waveform-shaping circuit; a comparator configured to compare a DC voltage obtained by smoothing the clock signal subjected to the waveform-shaping with a reference voltage; a logic circuit configured to set an adjustment value of the bias voltage of the bias voltage output circuit; and a storage circuit. In a test mode, the logic circuit changes the adjustment value to determine a set value of the adjustment value based on output of the comparator when the adjustment value is changed, and stores the determined set value in the storage circuit.

Another aspect of the present disclosure relates to an oscillator that includes a resonator and a circuit device configured to generate an oscillation signal by oscillating the resonator. The circuit device includes: an output circuit including a waveform-shaping circuit configured to waveform-shape the oscillation signal, and configured to output an output clock signal based on a clock signal subjected to the waveform-shaping by the waveform-shaping circuit; a bias voltage output circuit configured to output a bias voltage of the oscillation signal input to the waveform-shaping circuit; a comparator configured to compare a DC voltage obtained by smoothing the clock signal subjected to the waveform-shaping with a reference voltage; a logic circuit configured to set an adjustment value of the bias voltage of the bias voltage output circuit; and a storage circuit. In a test mode, the logic circuit changes the adjustment value to determine a set value of the adjustment value based on output of the comparator when the adjustment value is changed, and stores the determined set value in the storage circuit.

Another aspect of the present disclosure relates to a manufacturing method of an oscillator that includes a resonator and a circuit device configured to generate an oscillation signal by oscillating the resonator. The circuit device includes: an output circuit including a waveform-shaping circuit configured to waveform-shape the oscillation signal, and configured to output an output clock signal based on a clock signal subjected to the waveform-shaping by the waveform-shaping circuit; a bias voltage output circuit configured to output a bias voltage of the oscillation signal input to the waveform-shaping circuit; a comparator configured to compare a DC voltage obtained by smoothing the clock signal subjected to the waveform-shaping with a reference voltage; and a storage circuit. The manufacturing method includes: setting the circuit device to a test mode; changing the adjustment value in the test mode; searching for, based on output of the comparator when the adjustment value is changed, the adjustment value for setting a duty ratio of the output clock signal to a predetermined duty ratio; determining the found adjustment value as a set value of the adjustment value; and storing the determined set value in the storage circuit.

DESCRIPTION OF EXEMPLARY EMBODIMENTS

Hereinafter, the present embodiment will be described. The present embodiment to be described below does not unduly limit contents described in the claims. Moreover, not all of the configurations described in the present embodiment are essential constituent elements.

1. Circuit Device

Figure 1:
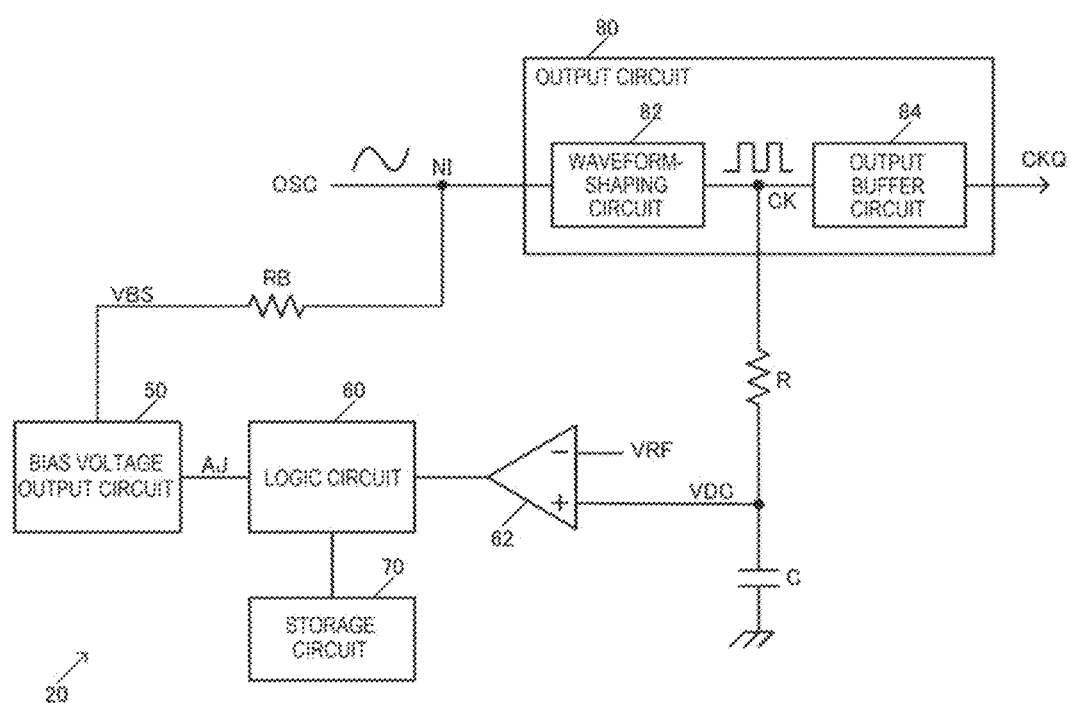
FIG. 1 is a configuration example of a circuit device according to the present embodiment.

FIG. 1 illustrates a configuration example of a circuit device 20 according to the present embodiment. The circuit device 20 according to the present embodiment includes a bias voltage output circuit 50, a logic circuit 60, a comparator 62, a storage circuit 70, and an output circuit 80.

An oscillation signal OSC is input to the output circuit 80. For example, as described later, the oscillation signal OSC generated by oscillating a resonator is input to the output circuit 80. The output circuit 80 includes a waveform-shaping circuit 82 that waveform-shapes the input oscillation signal OSC. For example, the waveform-shaping circuit 82 waveform-shapes a sine wave oscillation signal OSC and outputs a square wave clock signal CK. Thereafter, the output circuit 80 outputs an output clock signal CKQ based on the clock signal CK subjected to the waveform-shaping by the waveform-shaping circuit 82. For example, in FIG. 1, an output buffer circuit 84 is provided at a subsequent stage of the waveform-shaping circuit 82, and the output buffer circuit 84 buffers the clock signal CK and outputs the output clock signal CKQ.

The bias voltage output circuit 50 outputs a bias voltage VBS of the oscillation signal OSC input to the waveform-shaping circuit 82. The bias voltage output circuit 50 supplies the bias voltage VBS to an input node NI of the oscillation signal OSC via, for example, a resistor RB, so that a center voltage of the oscillation signal OSC can be set to the bias voltage VBS. For example, the sine wave oscillation signal OSC having the bias voltage VBS as the center voltage can be input to the waveform-shaping circuit 82.

The comparator 62 compares a DC voltage VDC obtained by smoothing the clock signal CK subjected to the waveform-shaping with a reference voltage VRF. For example, a resistor R for smoothing and a capacitor C are provided between an output node and a ground node of the clock signal CK. A coupling node of the resistor R and the capacitor C is coupled to a first input terminal of the comparator 62. As a result, the DC voltage VDC obtained by smoothing the clock signal CK is input to the first input terminal of the comparator 62. The reference voltage VRF is input to a second input terminal of the comparator 62, and thus the comparator 62 compares the DC voltage VDC with the reference voltage VRF. In FIG. 1, the first input terminal is a non-inverting input terminal of the comparator 62, and the second input terminal is an inverting input terminal of the comparator 62. The present embodiment is not limited thereto, and may be reversed. In addition, when a duty ratio as a target of duty adjustment is 50%, the reference voltage VRF is, for example, ½ of a power source voltage. In FIG. 1, an output signal of the waveform-shaping circuit 82 is the clock signal CK, and the clock signal CK may be a signal waveform-shaped by the waveform-shaping circuit 82, and may be, for example, a signal from a node between buffer circuits of the output buffer circuit 84. Hereinafter, a ground is appropriately referred to as GND. The GND can also be referred to as VSS, and a ground voltage is, for example, a ground potential.

The logic circuit 60 sets an adjustment value AJ of the bias voltage VBS of the bias voltage output circuit 50. For example, the logic circuit 60 changes the adjustment value AJ, and thus the bias voltage VBS output by the bias voltage output circuit 50 changes. The storage circuit 70 is a circuit that stores information, and is, for example, a memory.

In the present embodiment, the logic circuit 60 changes the adjustment value AJ in a test mode. The logic circuit 60 determines a set value of the adjustment value AJ based on output of the comparator 62 when the adjustment value AJ is changed. The logic circuit 60 stores the determined set value in the storage circuit 70.

For example, it is assumed that the reference voltage VRF is ½ of the power source voltage and the duty ratio as the target of the duty adjustment is 50%. In this case, it is assumed that the DC voltage VDC obtained by smoothing the clock signal CK is higher than the reference voltage VRF, and the comparator 62 outputs an H level. For example, when a width of the H level is larger than a width of an L level of the clock signal CK and the duty ratio is increased, the DC voltage VDC is increased to be higher than the reference voltage VRF, and the comparator 62 outputs the H level. In this case, the logic circuit 60 outputs the adjustment value AJ for decreasing the bias voltage VBS to the bias voltage output circuit 50. As a result, the duty ratio is adjusted to be small.

In addition, it is assumed that the DC voltage VDC obtained by smoothing the clock signal CK is lower than the reference voltage VRF, and the comparator 62 outputs the L level. For example, when the width of the H level is smaller than the width of the L level of the clock signal CK and the duty ratio is decreased, the DC voltage VDC is decreased to be lower than the reference voltage VRF, and the comparator 62 outputs the L level. In this case, the logic circuit 60 outputs the adjustment value AJ for increasing the bias voltage VBS to the bias voltage output circuit 50. As a result, the duty ratio is adjusted to be large. The H level is a high level, and the L level is a low level.

The logic circuit 60 determines, as the set value, the adjustment value AJ when a duty ratio of the output clock signal CKQ is set to a predetermined duty ratio, and writes the determined set value in the storage circuit 70. In a normal mode, which is a normal operation of the circuit device 20, the bias voltage output circuit 50 outputs the bias voltage VBS based on the adjustment value AJ according to the set value stored in the storage circuit 70.

Figure 2:
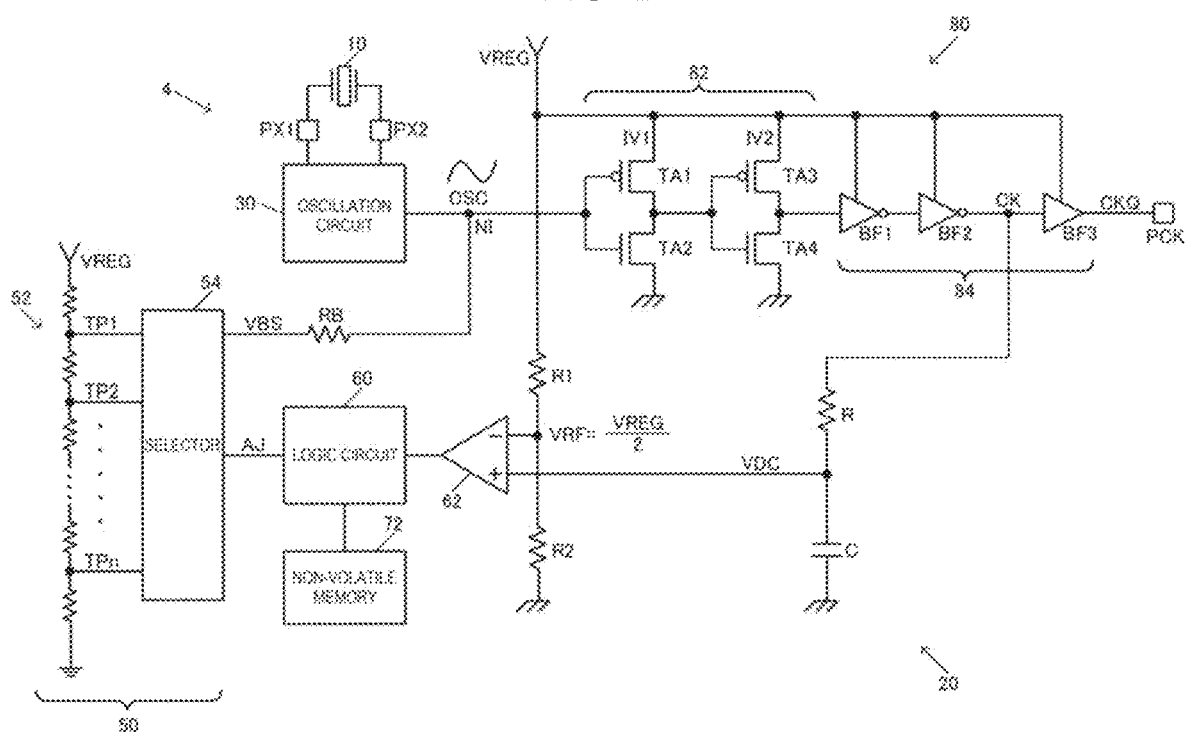
FIG. 2 is a specific configuration example of the circuit device and an oscillator according to the present embodiment.

FIG. 2 illustrates a specific configuration example of the circuit device 20. In FIG. 2, the circuit device 20 is provided with an oscillation circuit 30 that generates the oscillation signal OSC using a resonator 10. FIG. 2 illustrates a specific configuration example of the bias voltage output circuit 50, the waveform-shaping circuit 82, and the output buffer circuit 84, and a non-volatile memory 72 is provided as the storage circuit 70 of FIG. 1.

The circuit device 20 according to the present embodiment is, for example, an integrated circuit device called an integrated circuit (IC). For example, the circuit device 20 is an IC manufactured by a semiconductor process, and is a semiconductor chip in which circuit elements are formed on a semiconductor substrate. An oscillator 4 according to the present embodiment includes the resonator 10 and the circuit device 20. The resonator 10 is electrically coupled to the circuit device 20. For example, the resonator 10 is electrically coupled to the circuit device 20 by using an internal wiring of a package that accommodates the resonator 10 and the circuit device 20, a bonding wire, or a metal bump.

The resonator 10 is an element that generates mechanical oscillation by an electrical signal. The resonator 10 can be implemented by a resonator element such as a crystal resonator element. For example, the resonator 10 can be implemented by a crystal resonator element that has a cut angle of AT cut, SC cut, or the like and that performs thickness-shear oscillation, a tuning fork type crystal resonator element, or a double-tuning fork type crystal resonator element. For example, the resonator 10 may be a resonator built in a temperature compensated crystal oscillator (TCXO) not including a thermostatic bath, or may be a resonator built in an oven controlled crystal oscillator (OCXO) including a thermostatic bath. Alternatively, the resonator 10 may be a resonator built in an oscillator of a simple packaged crystal oscillator (SPXO). The resonator 10 according to the present embodiment can be implemented by various resonator elements such as a resonator element other than a thickness-shear oscillating type, a tuning fork type, or a double-tuning fork type, and a piezoelectric resonator element formed of a material other than quartz crystal. For example, a surface acoustic wave (SAW) resonator, or a micro electro mechanical systems (MEMS) resonator as a silicon resonator formed using a silicon substrate may be employed as the resonator 10.

The oscillation circuit 30 is a circuit that oscillates the resonator 10. For example, the oscillation circuit 30 is electrically coupled to pads PX1 and PX2, and generates the oscillation signal OSC by oscillating the resonator 10. The pad PX1 is a first resonator coupling pad, and the pad PX2 is a second resonator coupling pad. For example, the oscillation circuit 30 can be implemented by a drive circuit for oscillation provided between the pad PX1 and the pad PX2 and an active element such as a capacitor or a resistor. The drive circuit can be implemented by, for example, a CMOS inverter circuit or a bipolar transistor. The drive circuit is a core circuit of the oscillation circuit 30, and the drive circuit oscillates the resonator 10 by driving the resonator 10 with a voltage or a current. As the oscillation circuit 30, various types of oscillation circuits such as an inverter type, a Pierce type, a Colpitts type, or a Hartley type can be used. The oscillation circuit 30 is provided with a variable capacitance circuit, and an oscillation frequency can be adjusted by adjusting a capacitance of the variable capacitance circuit. The variable capacitance circuit can be implemented by a variable capacitance element such as a varactor. For example, the variable capacitance circuit can be implemented by the variable capacitance element whose capacitance is controlled based on a temperature compensation voltage. Alternatively, the variable capacitance circuit may be implemented by a capacitor array and a switch array coupled to the capacitor array. The coupling in the present embodiment is electrical coupling. The electrical coupling is coupling in which an electric signal can be transmitted, and coupling in which information can be transmitted by the electric signal. The electrical coupling may be coupling via a passive element or the like.

The waveform-shaping circuit 82 includes a first-stage inverter circuit IV1 to which the oscillation signal OSC is input, and a second-stage inverter circuit IV2 to which output of the inverter circuit IV1 is input. The inverter circuit IV1 includes a P-type transistor TA1 and an N-type transistor TA2 provided in series between a power source voltage VREG node and a GND node. The inverter circuit IV2 includes a P-type transistor TA3 and an N-type transistor TA4 provided in series between a VREG node and a GND node. The power source voltage VREG is, for example, a voltage obtained by regulating an external power source voltage by a regulator.

The output buffer circuit 84 includes buffer circuits BF1, BF2, and BF3. Output of the waveform-shaping circuit 82 is input to the buffer circuit BF1. The buffer circuit BF3 outputs the output clock signal CKQ to a pad PCK which is an output terminal of the circuit device 20. The buffer circuit BF2 is provided between the buffer circuits BF1 and BF3. The buffer circuit BF3 may be a CMOS output circuit, or may be a circuit that outputs a clipped sine wave signal. The waveform-shaped clock signal CK is the output signal of the waveform-shaping circuit 82 in FIG. 1, and is an output signal of the buffer circuit BF2 in FIG. 2. As described above, the waveform-shaped clock signal CK may be a signal based on the signal subjected to the waveform-shaping by the waveform-shaping circuit 82.

Resistors R1 and R2 are provided in series between the VREG node and a GND node, and resistance values of the resistors R1 and R2 are the same. Therefore, in the comparator 62, the DC voltage VDC obtained by smoothing the waveform-shaped clock signal CK is input to the first input terminal which is a non-inverting input terminal, and the reference voltage VRF=VREG/2 is input to the second input terminal which is an inverting input terminal.

The logic circuit 60 is a control circuit and performs various types of control processing. For example, the logic circuit 60 controls the entire circuit device 20 or controls an operation sequence of the circuit device 20. In addition, the logic circuit 60 performs various types of processing for controlling the oscillation circuit 30, or controls to read or write information from and in the non-volatile memory 72. The logic circuit 60 may be implemented by, for example, an application specific integrated circuit (ASIC) using automatic arrangement wiring such as a gate array.

The non-volatile memory 72 is a memory that holds storage of information even when a power source is not supplied. For example, the non-volatile memory 72 is a memory that can hold information even when the power source is not supplied and in which information can be rewritten. The non-volatile memory 72 stores various kinds of information necessary for operations and the like of the circuit device 20. The non-volatile memory 72 may be implemented by an electrically erasable programmable read-only memory (EEPROM) or the like implemented by a floating gate avalanche injection MOS memory (FAMOS memory) or a metal-oxide-nitride-oxide-silicon memory (MONOS memory).

The bias voltage output circuit 50 includes a ladder resistor circuit 52 and a selector 54. The ladder resistor circuit 52 is provided between a VREG node, which is a high potential side power source node, and a GND node, which is a low potential side power source node. For example, the ladder resistor circuit 52 includes a plurality of resistors provided in series between the VREG node and the GND node. The selector 54 selects one of a plurality of voltage division taps TP1 to TPn (N is an integer of 2 or more) of the ladder resistor circuit 52 based on the adjustment value AJ. Each of the voltage division taps TP1 to TPn is a tap of a coupling node between two adjacent resistors of the plurality of resistors constituting the ladder resistor circuit 52.

In the circuit device 20 according to the present embodiment configured as described above, the comparator 62 compares the DC voltage VDC obtained by smoothing the clock signal CK subjected to the waveform-shaping of the oscillation signal OSC by the waveform-shaping circuit 82 with the reference voltage VRF, and outputs a comparison result to the logic circuit 60. The bias voltage output circuit 50 outputs the bias voltage VBS of the oscillation signal OSC input to the waveform-shaping circuit 82. The logic circuit 60 sets the adjustment value AJ of the bias voltage VBS of the bias voltage output circuit 50. In the test mode, the logic circuit 60 changes the adjustment value AJ, and determines the set value of the adjustment value AJ based on the output of the comparator 62 when the adjustment value AJ is changed. For example, the circuit device 20 is set to the test mode at the time of inspection or the like before product shipment of the circuit device 20 or the oscillator 4. In the test mode, the logic circuit 60 changes the adjustment value AJ by a predetermined search algorithm such as a binary search to be described later, changes the bias voltage VBS of the oscillation signal OSC, and monitors the output of the comparator 62 that compares the DC voltage VDC obtained by smoothing the clock signal CK with the reference voltage VRF. The logic circuit 60 searches for, based on the output of the comparator 62, the adjustment value AJ for setting the duty ratio of the clock signal CK to the predetermined duty ratio such as 50%, using the search algorithm. For example, in FIG. 2, the comparator 62 compares the DC voltage VDC with the reference voltage VRF=VREG/2, which is ½ of the power source voltage VREG of the waveform-shaping circuit 82 that waveform-shapes the oscillation signal OSC. Therefore, the logic circuit 60 can determine the set value of the adjustment value AJ for setting the duty ratio of the output clock signal CKQ to, for example, 50% by searching for the adjustment value AJ for which, for example, the DC voltage VDC is substantially the same as the reference voltage VRF based on the output of the comparator 62. The logic circuit 60 stores the set value of the adjustment value AJ thus determined in the non-volatile memory 72, which is the storage circuit 70. In this way, the adjustment value AJ of the set value thus determined is input to the bias voltage output circuit 50, and thus the bias voltage output circuit 50 can output the bias voltage VBS for setting the duty ratio of the output clock signal CKQ based on the clock signal CK to the predetermined duty ratio such as 50%. As a result, the circuit device 20 can output the output clock signal CKQ having the predetermined duty ratio as the output clock signal CKQ based on the clock signal CK.

Figure 3:
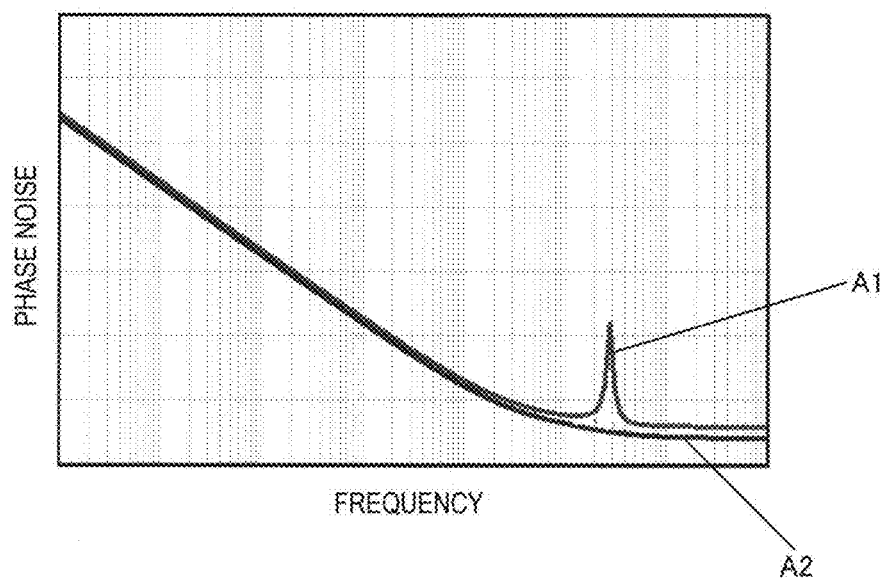
FIG. 3 is an explanatory diagram of a phase noise of a clock signal.

For example, in the related art of Patent Literature 1 described above, during a normal operation in which an oscillator outputs a clock signal, a signal based on the clock signal is fed back to an input-side amplifier. Therefore, there is a problem in which noise wraparound occurs, and finally, noise characteristics of the clock signal may further deteriorate. For example, FIG. 3 is an explanatory diagram of a phase noise generated in the clock signal. In FIG. 3, a horizontal axis represents a frequency, and a vertical axis represents a phase noise. As in the related art, in a method in which the signal based on the clock signal is fed back to the input-side amplifier, spurious occurs in the vicinity of a frequency of, for example, 200 KHz as indicated by A1 in FIG. 3, and the noise characteristics deteriorate.

In this regard, according to the method of the present embodiment, as indicated by A2 of FIG. 3, the spurious as in the related art does not occur, and the deterioration in the noise characteristics can be prevented. That is, in the present embodiment, in the test mode, the adjustment value AJ is set to an appropriate set value, and the bias voltage VBS of the oscillation signal OSC is set to an appropriate voltage, whereby the duty ratio of the output clock signal CKQ is set to a duty ratio within a range of a required specification. For example, the duty ratio is set to the duty ratio within the range of the required specification such as 50%±2%. In the normal mode, which is the normal operation, the feedback as in the related art does not have to be applied, and thus the deterioration in the noise characteristics can be effectively prevented as indicated by A2 of FIG. 3.

Next, a relation between the setting of the bias voltage VBS by the adjustment value AJ and the duty ratio will be described. For example, when the bias voltage VBS is adjusted to a low voltage by adjusting the adjustment value AJ, a duty ratio corresponding to a width of an H level of an output signal of the first-stage inverter circuit IV1 of the waveform-shaping circuit 82 increases. As a result, a duty ratio corresponding to a width of an H level of the output clock signal CKQ, which is final output of the circuit device 20, decreases. In addition, when the bias voltage VBS is adjusted to a high voltage by adjusting the adjustment value AJ, the duty ratio of the output signal of the first-stage inverter circuit IV1 of the waveform-shaping circuit 82 decreases. As a result, the duty ratio of the output clock signal CKQ increases.

Here, for example, it is assumed that a capability of the N-type transistor becomes SLOW due to variation in the semiconductor manufacturing process. In this case, a capability of the N-type transistor TA2 of the first-stage inverter circuit IV1 of the waveform-shaping circuit 82 is low, and thus the duty ratio of the output signal of the inverter circuit IV1 becomes large, and the duty ratio of the output clock signal CKQ becomes smaller than, for example, 50%. In this case, the duty ratio of the output clock signal CKQ is set to 50%, and thus the bias voltage VBS is increased by the adjustment value AJ. When the bias voltage VBS is increased in this way, the duty ratio of the output signal of the first-stage inverter circuit IV1 of the waveform-shaping circuit 82 becomes small, and the duty ratio of the output clock signal CKQ becomes large, and thus it is possible to adjust the duty ratio to 50%.

In this way, in the present embodiment, in the test mode during the manufacturing, the duty ratio of the output clock signal CKQ is set by adjusting the bias voltage VBS by the adjustment value AJ. As a result, when a capability of a transistor varies due to the variation in the manufacturing process, the set value of the adjustment value AJ for setting the output clock signal CKQ to have an appropriate duty ratio can be stored in the storage circuit 70 such as the non-volatile memory 72. Therefore, it is possible to prevent variation in the duty ratio of the output clock signal CKQ due to the variation in the manufacturing process.

In the present embodiment, in the normal mode, the bias voltage output circuit 50 outputs the bias voltage VBS based on the adjustment value AJ according to the set value stored in the storage circuit 70. For example, in the present embodiment, as described above, in the test mode, the set value of the adjustment value AJ for setting the output clock signal CKQ to have an appropriate duty ratio is determined, and the determined set value is stored in the storage circuit 70. In the normal mode, the bias voltage output circuit 50 outputs the bias voltage VBS of the oscillation signal OSC based on the adjustment value AJ according to the set value stored in the storage circuit 70 in this way. As a result, in the normal mode, the bias voltage output circuit 50 can output the bias voltage VBS based on the adjustment value AJ according to the set value for setting the output clock signal CKQ to have an appropriate duty ratio in the test mode. Therefore, in the normal mode, the circuit device 20 can output the output clock signal CKQ having an appropriate duty ratio as in the test mode. In the normal mode, it is not necessary to provide a feedback path as in Patent Literature 1, and thus it is also possible to prevent the deterioration in the noise characteristics as illustrated in FIG. 3. Therefore, it is possible to achieve both the output of the output clock signal CKQ having an appropriate duty ratio and the prevention of the deterioration in the noise characteristics.

In FIG. 2, the bias voltage output circuit 50 includes the ladder resistor circuit 52 provided between the VREG node and the GND node, and the selector 54 that selects one of the plurality of voltage division taps TP1 to TPn of the ladder resistor circuit 52 based on the adjustment value AJ. In this way, the selector 54 selects one of the plurality of voltage division taps TP1 to TPn of the ladder resistor circuit 52 based on the adjustment value AJ from the logic circuit 60, and thus the bias voltage VBS according to the adjustment value AJ can be output as a bias voltage of the oscillation signal OSC. Therefore, by the bias voltage output circuit 50 having a simple configuration, it is possible to output the bias voltage VBS according to the adjustment value AJ from the logic circuit 60, and to output the output clock signal CKQ having an appropriate duty ratio.

In FIG. 2, the storage circuit 70 in FIG. 1 is the non-volatile memory 72. As a result, the set value of the adjustment value AJ for setting the output clock signal CKQ to have an appropriate duty ratio is stored in the non-volatile memory 72 capable of holding the storage of the information even when the power source is not supplied. Therefore, when the power source is turned on in the normal mode, the logic circuit 60 reads the set value of the adjustment value AJ from the non-volatile memory 72 and outputs the set value to the bias voltage output circuit 50, and thus the output clock signal CKQ having an appropriate duty ratio can be output.

2. Another Specific Example

Figure 4:
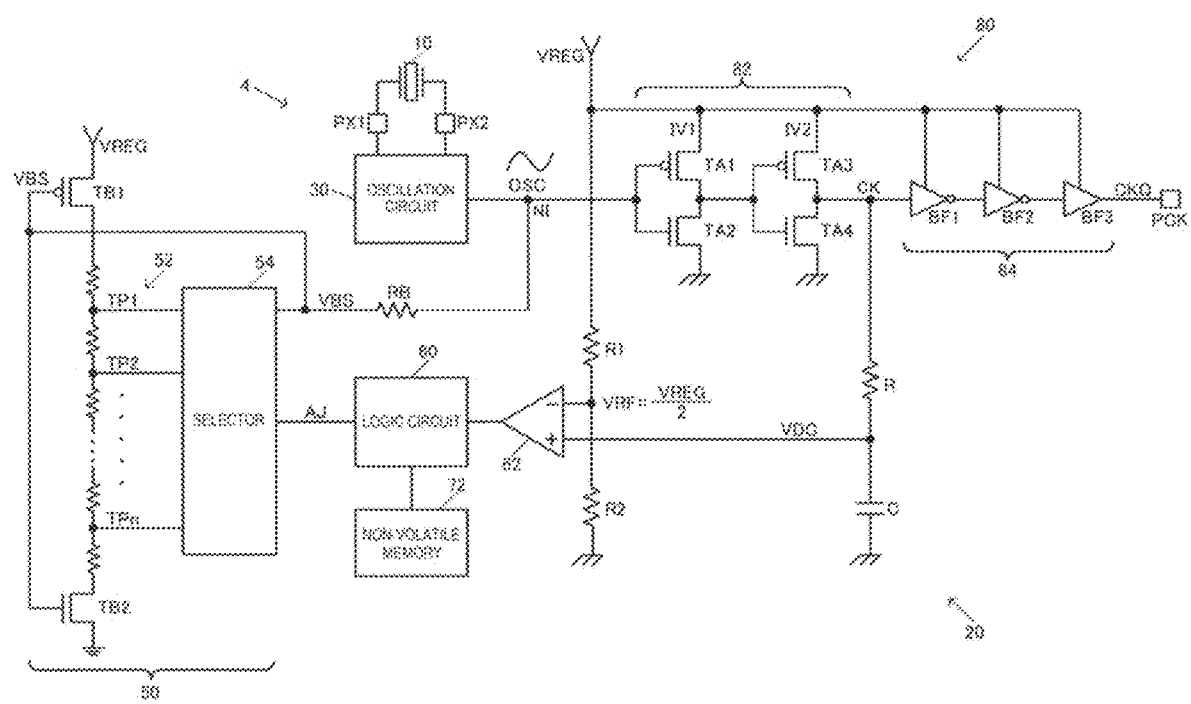
FIG. 4 is another specific configuration example of the circuit device according to the present embodiment.

FIG. 4 illustrates another specific configuration example of the circuit device 20 according to the present embodiment. FIG. 4 is different from the configuration of FIG. 2 in that transistors TB1 and TB2 serving as replicas of the transistors TA1 and TA2 of the first-stage inverter circuit IV1 of the waveform-shaping circuit 82 are provided in the bias voltage output circuit 50 in FIG. 4. That is, in FIG. 4, the bias voltage output circuit 50 includes a P-type transistor TB1 provided between the VREG node, which is a high potential side power source node, and one end of the ladder resistor circuit 52, and having a gate to which the bias voltage VBS is input. The one end of the ladder resistor circuit 52 is one end in a high potential side of the ladder resistor circuit 52, and is one end of a resistor provided on the highest potential side among the plurality of resistors of the ladder resistor circuit 52. In addition, the bias voltage output circuit 50 includes an N-type transistor TB2 provided between the other end of the ladder resistor circuit 52 and the GND node, which is the low potential side power source node, and having a gate to which the bias voltage VBS is input. The other end of the ladder resistor circuit 52 is one end in a low potential side of the ladder resistor circuit 52, and is one end of a resistor provided on the lowest potential side among the plurality of resistors of the ladder resistor circuit 52.

In this way, the transistors TB1 and TB2 serving as the replicas of the transistors TA1 and TA2 of the first-stage inverter circuit IV1 of the waveform-shaping circuit 82 are provided in the bias voltage output circuit 50, and thus it is possible to prevent influence of corner variations in the semiconductor manufacturing process. The corner variations are variations of FF, SS, SF, and FS. FF is a case when both an N-type transistor and a P-type transistor are FSAT. SS is a case when both the N-type transistor and the P-type transistor are SLOW. SF is a case when the N-type transistor is SLOW and the P-type transistor is FSAT. FS is a case when the N-type transistor is FAST and the P-type transistor is SLOW.

For example, in FIG. 4, when the N-type transistor TA2 and the P-type transistor TA1 of the waveform-shaping circuit 82 are FSAT, the N-type transistor TB2 and the P-type transistor TB1 of the ladder resistor circuit 52 are also FAST. Therefore, influence of the corner variation of FF can be reduced. When the N-type transistor TA2 and the P-type transistor TA1 of the waveform-shaping circuit 82 are SLOW, the N-type transistor TB2 and the P-type transistor TB1 of the ladder resistor circuit 52 are also SLOW. Therefore, influence of the corner variation of SS can be reduced. The same applies to the corner variations of FS and SF.

Since the influence of the corner variations in the semiconductor manufacturing process can be reduced as described above, an adjustment width in the ladder resistor circuit 52 can be narrowed, and thus an area of the bias voltage output circuit 50 can be reduced. For example, a layout area of each of the plurality of resistors of the ladder resistor circuit 52 is larger than other circuits, but a layout area of the plurality of resistors can be reduced by reducing the adjustment width, and the area of the circuit device 20 can be reduced.

Figure 5:
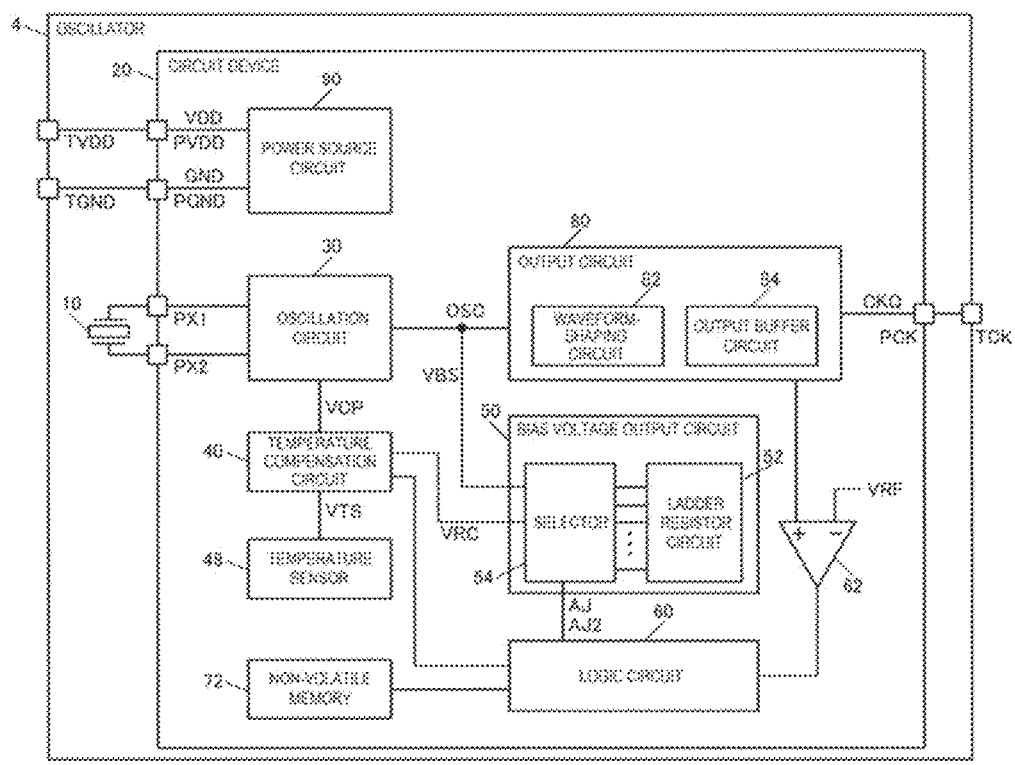
FIG. 5 is another specific configuration example of the circuit device according to the present embodiment.

FIG. 5 illustrates another specific configuration example of the circuit device 20 and the oscillator 4 according to the present embodiment. In FIG. 5, the circuit device 20 further includes a temperature compensation circuit 40, a temperature sensor 48, and a power source circuit 90. VDD, which is the power source voltage, and GND, which is the ground voltage, are supplied from terminals TVDD and TGND of the oscillator 4 to pads PVDD and PGND of the circuit device 20. The output clock signal CKQ from the output circuit 80 is output outside from the pad PCK of the circuit device 20 via a terminal TCK of the oscillator 4.

The power source circuit 90 is supplied with the VDD from the pad PVDD and the GND from the pad PGND, and supplies various power source voltages for internal circuits of the circuit device 20 to the internal circuits. For example, the power source circuit 90 supplies a regulated power source voltage obtained by regulating the power source voltage VDD to circuits of the circuit device 20.

The temperature compensation circuit 40 is a circuit that performs temperature compensation for the oscillation frequency of the oscillation circuit 30. For example, the temperature compensation circuit 40 outputs, based on a temperature detection voltage VTS which is a temperature detection result of the temperature sensor 48, a temperature compensation voltage VCP for performing temperature compensation for the oscillation frequency of the oscillation circuit 30. The temperature compensation is, for example, a process of executing compensation by preventing variation of the oscillation frequency caused by a temperature variation. That is, the temperature compensation circuit 40 performs the temperature compensation for the oscillation frequency of the oscillation circuit 30 so that the oscillation frequency is constant even when the temperature variation occurs.

Specifically, the temperature compensation circuit 40 performs analog temperature compensation using, for example, polynomial approximation. For example, when the temperature compensation voltage VCP for compensating frequency-temperature characteristics of the resonator 10 is approximated by using a polynomial, the temperature compensation circuit 40 performs the analog temperature compensation based on coefficient information of the polynomial. The analog temperature compensation is, for example, temperature compensation implemented by an addition process of a current signal or a voltage signal that is an analog signal. For example, when the temperature compensation voltage VCP is approximated by using a high-order polynomial, a zero-order coefficient, a first-order coefficient, and a high-order coefficient of the polynomial are stored in, for example, the non-volatile memory 72 as zero-order correction data, first-order correction data, and high-order correction data, respectively. The high-order coefficient is, for example, a coefficient of an order higher than the first-order, and the high-order correction data is correction data corresponding to the high-order coefficient. For example, when the temperature compensation voltage VCP is approximated by using a cubic polynomial, a zero-order coefficient, a first-order correction, a quadratic coefficient, and a cubic coefficient of the polynomial are stored in the non-volatile memory 72 as zero-order correction data, first-order correction data, quadratic correction data, and cubic correction data. Then, the temperature compensation circuit 40 performs the temperature compensation based on the zero-order correction data to the cubic correction data. In this case, the quadratic correction data and the temperature compensation based on the quadratic correction data may be omitted. For example, when the temperature compensation voltage VCP is approximated by using a quintic polynomial, a zero-order coefficient, a first-order coefficient, a quadratic coefficient, a cubic coefficient, a quartic coefficient, and a quintic coefficient of the polynomial are stored in the non-volatile memory 72 as zero-order correction data, first-order correction data, quadratic correction data, cubic correction data, quartic correction data, and quintic correction data. Then, the temperature compensation circuit 40 performs the temperature compensation based on the zero-order correction data to the quintic correction data. In this case, the quadratic correction data or the quartic correction data, and the temperature compensation based on the quadratic correction data or the quartic correction data may be omitted. The order of polynomial approximation may be optional, and for example, polynomial approximation of an order higher than the fifth order may be performed. The zero-order correction may be performed by the temperature sensor 48.

The temperature sensor 48 is a sensor that detects a temperature. Specifically, the temperature sensor 48 outputs, as the temperature detection voltage VTS, a temperature dependent voltage that changes according to an environmental temperature. For example, the temperature sensor 48 generates the temperature detection voltage VTS, which is a temperature detection signal, by using a circuit element having temperature dependency. Specifically, the temperature sensor 48 outputs the temperature detection voltage VTS whose voltage changes depending on the temperature, by using, for example, the temperature dependency of a forward voltage of a PN junction. A modification in which a digital temperature sensor circuit is used as the temperature sensor 48 is also possible. In this case, the temperature detection voltage VTS may be generated by performing D/A conversion on temperature detection data.

As described above, the circuit device 20 according to the present embodiment includes the temperature compensation circuit 40 that performs the temperature compensation for the oscillation frequency of the oscillation signal OSC. As illustrated in FIG. 5, the bias voltage output circuit 50 outputs the bias voltage VBS of the oscillation signal OSC, and outputs a reference voltage VRC for temperature compensation of the temperature compensation circuit 40 to the temperature compensation circuit 40.

For example, as described above, the selector 54 of the bias voltage output circuit 50 selects one of the plurality of voltage division taps of the ladder resistor circuit 52 based on the adjustment value AJ from the logic circuit 60, and thus the bias voltage VBS of the oscillation signal OSC is output. Meanwhile, the selector 54 selects one of the plurality of voltage division taps of the ladder resistor circuit 52 based on a second adjustment value AJ2 from the logic circuit 60, and thus the reference voltage VRC for temperature compensation is output to the temperature compensation circuit 40. In this way, not only the bias voltage VBS but also the reference voltage VRC for temperature compensation can be generated and output by effectively utilizing circuits such as the selector 54 of the bias voltage output circuit 50, and thus the circuits can be shared, and the circuit device 20 can be reduced in size.

Figure 6:
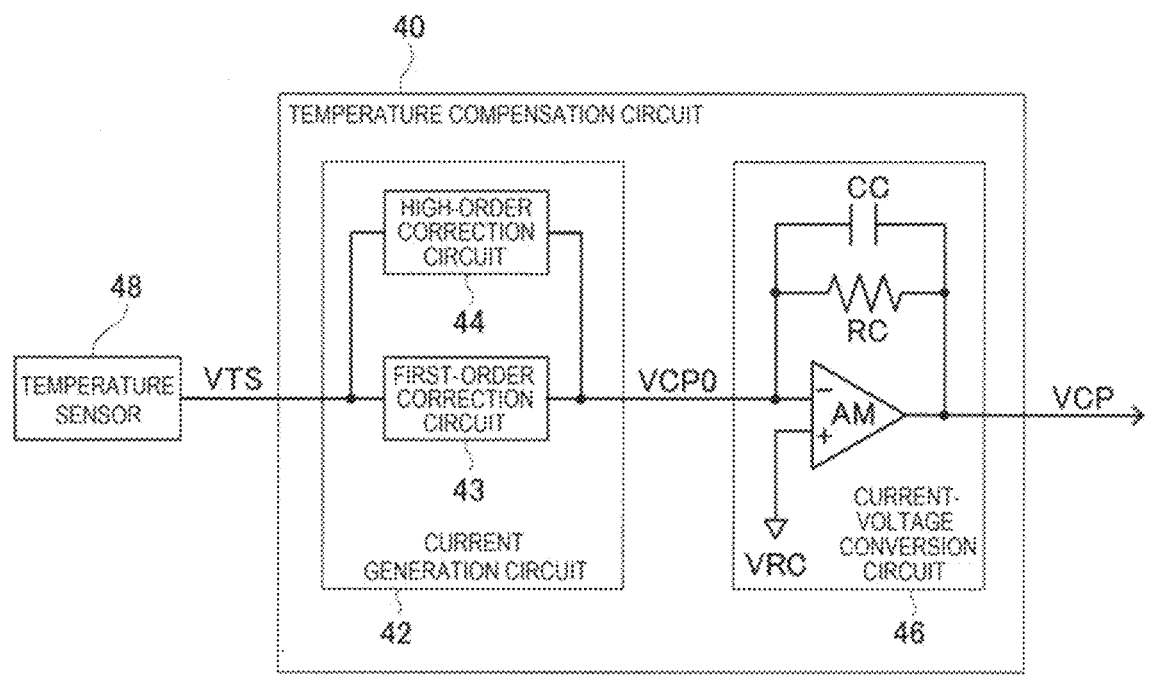
FIG. 6 is a configuration example of a temperature compensation circuit.

FIG. 6 illustrates a configuration example of the temperature compensation circuit 40. The temperature compensation circuit 40 is a circuit that outputs the temperature compensation voltage VCP according to the polynomial approximation using a temperature as a variable. The temperature compensation circuit 40 includes a current generation circuit 42 and a current-voltage conversion circuit 46. The current generation circuit 42 generates a function current based on the temperature detection result of the temperature sensor 48. For example, the current generation circuit 42 generates the function current for performing the temperature compensation on the frequency-temperature characteristics of the resonator 10, based on the temperature detection voltage VTS which is the temperature detection result from the temperature sensor 48. The current-voltage conversion circuit 46 converts the function current from the current generation circuit 42 into a voltage and outputs the temperature compensation voltage VCP.

The current generation circuit 42 includes a first-order correction circuit 43 and a high-order correction circuit 44. The first-order correction circuit 43 outputs a first-order current approximating a first-order function, based on the temperature detection voltage VTS. For example, the first-order correction circuit 43 outputs a first-order function current based on first-order correction data corresponding to a first-order correction of a polynomial in the polynomial approximation. The high-order correction circuit 44 outputs a high-order current approximating a high-order function to the current-voltage conversion circuit 46, based on the temperature detection voltage VTS. For example, the high-order correction circuit 44 outputs the high-order current based on high-order correction data corresponding to a high-order coefficient of a polynomial in the polynomial approximation. As an example, the high-order correction circuit 44 outputs a cubic current approximating a cubic function. In this case, the high-order correction circuit 44 includes a first differential circuit that performs a differential operation based on the temperature detection voltage VTS, and a second differential circuit that performs a differential operation based on an output voltage of the first differential circuit and the temperature detection voltage VTS to output the cubic current. In FIG. 6, the temperature sensor 48 performs offset correction on the temperature detection voltage VTS based on zero-order correction data corresponding to a zero-order coefficient of a polynomial. That is, the temperature sensor 48 adjusts the offset of the temperature detection voltage VTS by offset indicated by the zero-order correction data. The offset correction on the temperature detection voltage VTS corresponds to zero-order correction in the temperature compensation for the oscillation frequency. The high-order correction circuit 44 may further include a correction circuit that performs quartic or higher-order correction. For example, the high-order correction circuit 44 may further include a quartic correction circuit that outputs a quartic current approximating a quartic function, a quintic correction circuit that outputs a quintic current approximating a quintic function, and the like.

The current-voltage conversion circuit 46 adds the first-order current and the high-order current, and performs current-voltage conversion on the current obtained by adding to output the temperature compensation voltage VCP. Accordingly, the temperature compensation voltage VCP that approximates the polynomial function is generated.

As illustrated in FIG. 6, the reference voltage VRC for temperature compensation from the bias voltage output circuit 50 is supplied to the current-voltage conversion circuit 46, and is also supplied to the first-order correction circuit 43 and the high-order correction circuit 44 of the current generation circuit 42. For example, the reference voltage VRC is supplied to the first-order correction circuit 43 and the high-order correction circuit 44 as a voltage corresponding to an inflection point of a temperature characteristic. For example, at an inflection point corresponding to a typical temperature or the like, the current flowing from the first-order correction circuit 43 and the high-order correction circuit 44 is set to zero. The first-order correction circuit 43 generates, for example, a first-order function current whose origin is the inflection point. The high-order correction circuit 44 generates, for example, a high-order function current whose origin is the inflection point. The inflection point is set by the reference voltage VRC.

3. Binary Search

In the present embodiment, the logic circuit 60 determines the set value of the adjustment value AJ by changing the adjustment value AJ by, for example, a binary search. The logic circuit 60 writes the set value determined in the test mode into the storage circuit 70 such as the non-volatile memory 72. In this way, the set value of the adjustment value AJ for setting the output clock signal CKQ to have an appropriate duty ratio can be efficiently found by the binary search, and the found set value can be stored in the storage circuit 70.

Figure 7:
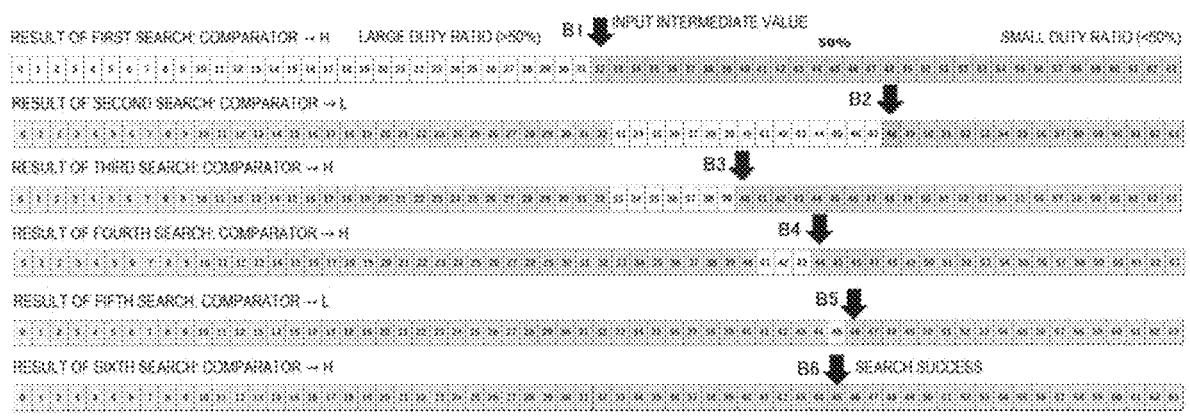
FIG. 7 is an explanatory diagram of a set value determination process by a binary search.
Figure 8:
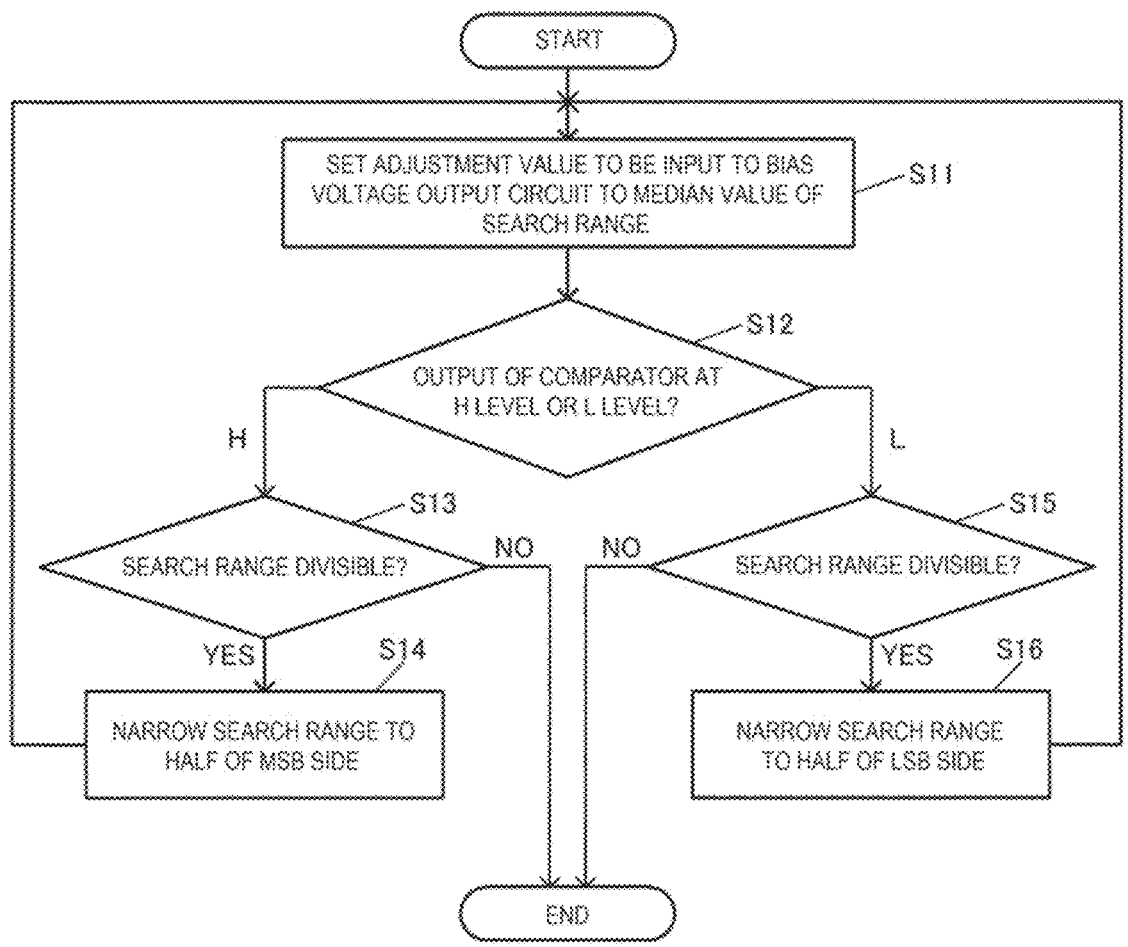
FIG. 8 is a flow diagram of the set value determination process by the binary search.

FIG. 7 is an explanatory diagram of a set value determination process by the binary search. In the present embodiment, the adjustment value AJ for setting the bias voltage VBS having a duty ratio of 50% is searched for by the search algorithm of the binary search. First, as indicated by B1 of FIG. 7, the logic circuit 60 inputs an intermediate value to the bias voltage output circuit 50 as the adjustment value AJ. As a result, as illustrated in FIG. 7, when the output of the comparator 62 is at the H level, the duty ratio is larger than 50%, and thus in a second search, the intermediate value on a set side at which the duty ratio decreases is input, as indicated by B2. As a result, as illustrated in FIG. 7, when the output of the comparator 62 is at the L level, the duty ratio is smaller than 50%, and thus in a third search, the intermediate value on the set side at which the duty ratio increases is input, as indicated by B3. In this way, in FIG. 7, as indicated by B4, B5, and B6, the search is further repeated three times, and by repeating six times, the search of the adjustment value AJ for setting the duty ratio to 50% is successful. In FIG. 7, as indicated by B6, when the adjustment value is AJ=45, the duty ratio is found to be 50%, and thus the set value of AJ=45 is written in the storage circuit 70 such as the non-volatile memory 72. FIG. 8 is a flow diagram of the set value determination process by the binary search. First, the logic circuit 60 sets the adjustment value AJ to be input to the bias voltage output circuit 50 to a median value of a search range (step S11). Then, the logic circuit 60 determines whether the output of the comparator 62 is at the H level or the L level (step S12). When the output of the comparator 62 is at the H level, the logic circuit 60 determines whether the search range is divisible (step S13), and narrows the search range to half on an MSB side when the search range is divisible (step S14), and returns to step S11. In contrast, when the output of the comparator 62 is at the L level, the logic circuit 60 determines whether the search range is divisible (step S15), and narrows the search range to half on an LSB side when the search range is divisible (step S16), and returns to step S11. The logic circuit 60 repeats the above processing until the search range is no longer divisible, thereby determining the set value of the adjustment value AJ and storing the determined set value in the storage circuit 70. As described above, in the present embodiment, the set value of the adjustment value AJ is determined by changing the adjustment value by the binary search, and thus the set value of the adjustment value AJ for setting the output clock signal CKQ to have an appropriate duty ratio can be efficiently found by the binary search.

4. Manufacturing Method

Figure 9:
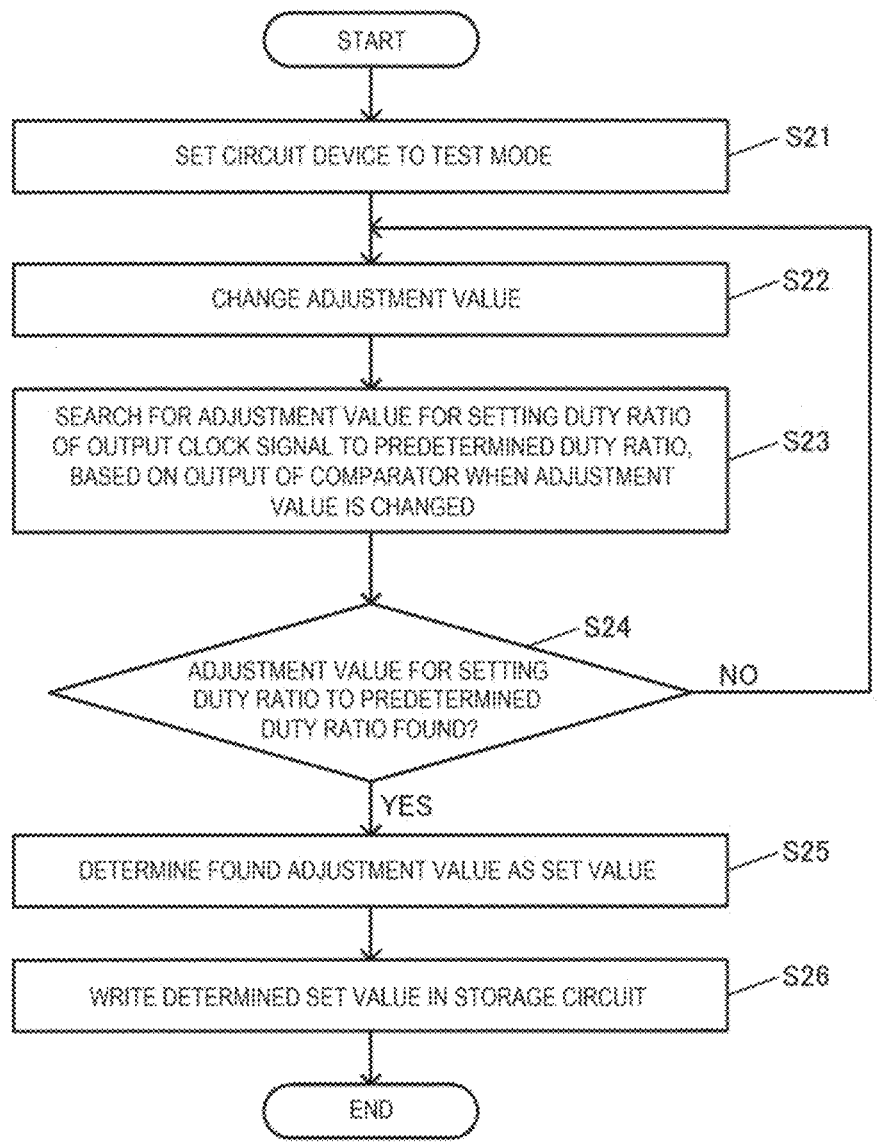
FIG. 9 is a flow diagram illustrating a manufacturing method of an oscillator according to the present embodiment.

Next, a manufacturing method of the oscillator 4 according to the present embodiment will be described. FIG. 9 is a flow diagram illustrating the manufacturing method of the oscillator 4 according to the present embodiment. As a premise of the flow diagram of FIG. 9, a step of forming circuit elements on a semiconductor wafer and manufacturing an IC chip of the circuit device 20 by dicing and a step of manufacturing the oscillator 4 by mounting the IC chip of the circuit device 20 and the resonator 10 on a package are performed.

First, as illustrated in step S21 of FIG. 9, a step of setting the circuit device 20 to the test mode is performed. The setting of the test mode is achieved by writing the setting of the test mode to a mode setting register of the logic circuit 60 by, for example, a tester. Next, as illustrated in step S22, a step of changing the adjustment value AJ in the test mode is performed. As illustrated in step S23, a step of searching for the adjustment value AJ for setting the duty ratio of the output clock signal CKQ to the predetermined duty ratio such as 50%, based on the output of the comparator 62 when the adjustment value AJ is changed is performed. For example, the adjustment value AJ for setting the duty ratio to the predetermined duty ratio is searched for by the binary search as illustrated in FIGS. 7 and 8. Specifically, the logic circuit 60 searches for the adjustment value AJ for setting the duty ratio to the predetermined duty ratio by executing the search algorithm such as the binary search, while changing the adjustment value AJ.

Next, as illustrated in step S24, it is determined whether the adjustment value AJ for setting the duty ratio of the output clock signal CKQ to the predetermined duty ratio is found. When the adjustment value AJ is not found, the process returns to step S22. On the other hand, when the adjustment value AJ is found, a step of determining the found adjustment value AJ as the set value is performed as illustrated in step S25. Then, as illustrated in step S26, a step of writing the determined set value in the storage circuit 70 is performed. Specifically, the logic circuit 60 performs processing of writing the determined set value in the storage circuit 70 such as the non-volatile memory 72.

As described above, the manufacturing method according to the present embodiment includes the step of setting the circuit device 20 to the test mode (S21) and the step of changing the adjustment value AJ in the test mode (S22). In addition, the manufacturing method according to the present embodiment includes the step of searching for the adjustment value AJ for setting the duty ratio of the output clock signal CKQ to the predetermined duty ratio, based on the output of the comparator 62 when the adjustment value AJ is changed (S23 and S24). The manufacturing method according to the present embodiment also includes the step of determining the found adjustment value AJ as the set value of the adjustment value AJ (S25) and the step of storing the determined set value in the storage circuit 70 (S26). According to such a manufacturing method of the oscillator 4, it is possible to manufacture the oscillator 4 capable of outputting the output clock signal CKQ in which the predetermined duty ratio is appropriately set and also capable of effectively preventing the deterioration in the noise characteristics of the output clock signal CKQ.

5. Oscillator

Figure 10:
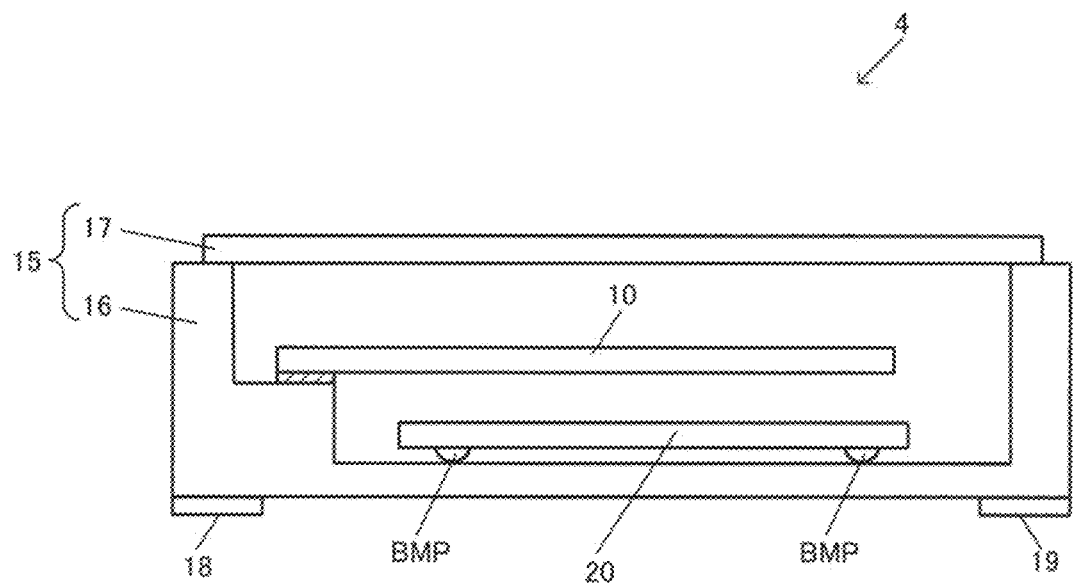
FIG. 10 is a first structural example of an oscillator.

FIG. 10 illustrates a first structural example of the oscillator 4 according to the present embodiment. The oscillator 4 includes the resonator 10, the circuit device 20, and a package 15 that houses the resonator 10 and the circuit device 20. The package 15 is made of, for example, ceramic, or the like and includes a housing space inside the package 15, and the resonator 10 and the circuit device 20 are housed in the housing space. The housing space is hermetically sealed and is preferably in a decompressed state, which is a state close to vacuum. The package 15 can suitably protect the resonator 10 and the circuit device 20 from impact, dust, heat, moisture, or the like.

The package 15 includes a base 16 and a lid 17. Specifically, the package 15 includes the base 16 that supports the resonator 10 and the circuit device 20, and the lid 17 that is joined to an upper surface of the base 16 so as to form the housing space between the lid 17 and the base 16. The resonator 10 is supported by a step portion provided inside the base 16 via a terminal electrode. The circuit device 20 is disposed on an inner bottom surface of the base 16. Specifically, the circuit device 20 is disposed such that an active surface faces the inner bottom surface of the base 16. The active surface is a surface at which the circuit elements of the circuit device 20 are formed. Further, bumps BMP are formed at terminals of the circuit device 20. The circuit device 20 is supported by the inner bottom surface of the base 16 via the conductive bumps BMP. The conductive bumps BMP are, for example, metal bumps, and the resonator 10 is electrically coupled to the circuit device 20 via the bumps BMP, an internal wiring of the package 15, the terminal electrode, and the like. The circuit device 20 is electrically coupled to external terminals 18 and 19 of the oscillator 4 via the bumps BMP and the internal wiring of the package 15. The external terminals 18 and 19 are formed at an outer bottom surface of the package 15. The external terminals 18 and 19 are coupled to an external device via an external wiring. The external wiring is, for example, a wiring formed at a circuit substrate on which the external device is mounted. Accordingly, a clock signal or the like can be output to the external device.

Although the circuit device 20 is flip mounted so that the active surface of the circuit device 20 faces downward in FIG. 10, the present embodiment is not limited to such mounting. For example, the circuit device 20 may be mounted so that the active surface of the circuit device 20 faces upward. That is, the circuit device 20 is mounted so that the active surface faces the resonator 10.

Figure 11:
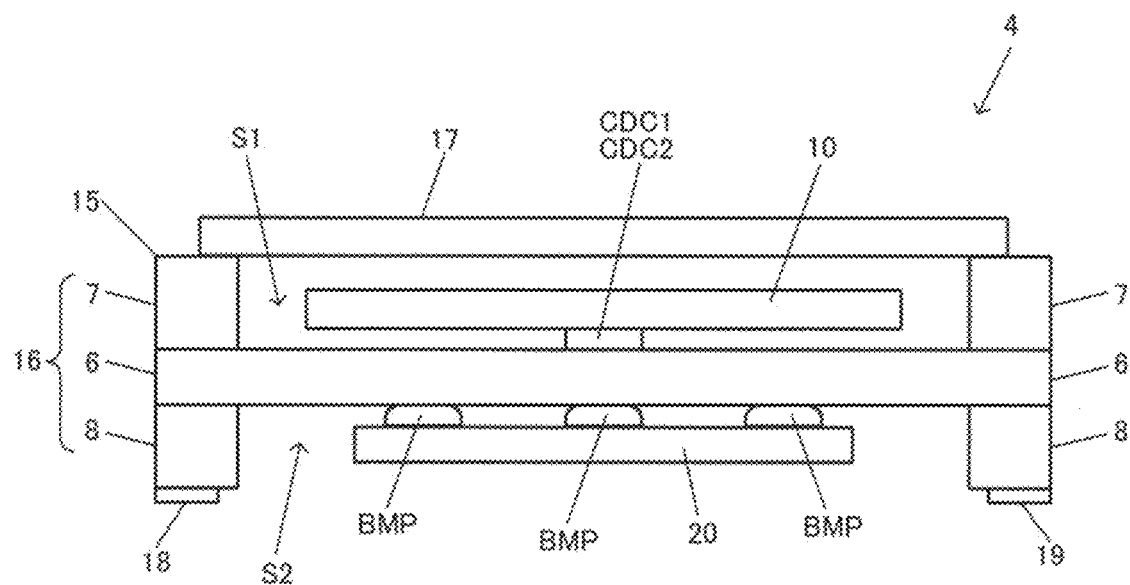
FIG. 11 is a second structural example of the oscillator.

FIG. 11 illustrates a second structural example of the oscillator 4. The oscillator 4 includes the resonator 10, the circuit device 20, and the package 15 that houses the resonator 10 and the circuit device 20. The package 15 includes the base 16 and the lid 17. The base 16 includes a first substrate 6 which is an intermediate substrate, a second substrate 7 having a substantially rectangular frame shape and laminated on an upper surface side of the first substrate 6, and a third substrate 8 having a substantially rectangular frame shape and laminated on a bottom surface side of the first substrate 6. The lid 17 is joined to an upper surface of the second substrate 7, and the resonator 10 is housed in a housing space S1 formed by the first substrate 6, the second substrate 7, and the lid 17. For example, the resonator 10 is hermetically sealed in the housing space S1 and is preferably in the decompressed state, which is a state close to vacuum. Accordingly, the resonator 10 can be suitably protected from impact, dust, heat, moisture, or the like. The circuit device 20 which is a semiconductor chip is housed in a housing space S2 formed by the first substrate 6 and the third substrate 8. The external terminals 18 and 19 which are electrode terminals of the oscillator 4 for external coupling are formed at a bottom surface of the third substrate 8.

In the housing space S1, the resonator 10 is coupled to a first electrode terminal and a second electrode terminal (not illustrated) formed at an upper surface of the first substrate 6, by conductive coupling portions CDC1 and CDC2. The conductive coupling portions CDC1 and CDC2 may be implemented by conductive bumps such as metal bumps, or may be implemented by conductive adhesives. Specifically, for example, a first electrode pad (not illustrated) formed at one end of the tuning fork type resonator 10 is coupled to the first electrode terminal formed at the upper surface of the first substrate 6, via the conductive coupling portion CDC1. The first electrode terminal is electrically coupled to the pad PX1 of the circuit device 20. A second electrode pad (not illustrated) formed at the other end of the tuning fork type resonator 10 is coupled to the second electrode terminal formed at the upper surface of the first substrate 6, via the conductive coupling portion CDC2. The second electrode terminal is electrically coupled to the pad PX2 of the circuit device 20. Accordingly, the one end and the other end of the resonator 10 can be electrically coupled to the pads PX1 and PX2 of the circuit device 20 via the conductive coupling portions CDC1 and CDC2. The conductive bumps BMP are formed at a plurality of pads of the circuit device 20 which is the semiconductor chip, and these conductive bumps BMP are coupled to a plurality of electrode terminals formed at a bottom surface of the first substrate 6. The electrode terminals coupled to the pads of the circuit device 20 are electrically coupled to the external terminals 18 and 19 of the oscillator 4 via the internal wiring and the like.

The oscillator 4 may be an oscillator of a wafer level package (WLP). In this case, the oscillator 4 includes: a semiconductor substrate; a base including a penetration electrode penetrating between a first surface and a second surface of the semiconductor substrate; the resonator 10 fixed to the first surface of the semiconductor substrate via a conductive joining member such as a metal bump; and an external terminal provided at a second surface side of the semiconductor substrate via an insulating layer such as a rearrangement wiring layer. An integrated circuit serving as the circuit device 20 is formed at the first surface or the second surface of the semiconductor substrate. In this case, a plurality of bases and a plurality of lids are joined by bonding a first semiconductor wafer on which the plurality of bases on which the resonator 10 and the integrated circuit are disposed are formed and a second semiconductor wafer on which the plurality of lids are formed, and then, individual pieces of the oscillator 4 are divided by a dicing saw or the like. As a result, the oscillator 4 of the wafer level package can be implemented, and the oscillator 4 can be manufactured with high throughput and low cost.

As described above, a circuit device according to the present embodiment includes an output circuit including a waveform-shaping circuit configured to waveform-shape an oscillation signal, and configured to output an output clock signal based on a clock signal subjected to the waveform-shaping by the waveform-shaping circuit. The circuit device further includes: a bias voltage output circuit configured to output a bias voltage of the oscillation signal input to the waveform-shaping circuit; a comparator configured to compare a DC voltage obtained by smoothing the clock signal subjected to the waveform-shaping with a reference voltage; a logic circuit configured to set an adjustment value of the bias voltage of the bias voltage output circuit; and a storage circuit. In a test mode, the logic circuit changes the adjustment value to determine a set value of the adjustment value based on output of the comparator when the adjustment value is changed, and stores the determined set value in the storage circuit.

According to the present embodiment, the oscillation signal is waveform-shaped, the output clock signal based on the clock signal subjected to the waveform-shaping is output, and the bias voltage of the oscillation signal is output. The DC voltage obtained by smoothing the clock signal subjected to the waveform-shaping is compared with the reference voltage, and the adjustment value of the bias voltage is set. In the test mode, the adjustment value is changed, the set value of the adjustment value is determined based on the output of the comparator when the adjustment value is changed, and the determined set value is stored in the storage circuit. By determining the set value of the adjustment value in this way, the duty ratio of the output clock signal can be set to an appropriate duty ratio. Since the set value of the adjustment value is stored in the storage circuit in advance, deterioration in noise characteristics of the output clock signal can be prevented. Therefore, it is possible to provide a circuit device capable of outputting an output clock signal in which an appropriate duty ratio is set and noise deterioration is reduced.

In the present embodiment, in a normal mode, the bias voltage output circuit may output the bias voltage based on the adjustment value according to the set value stored in the storage circuit.

As a result, in the normal mode, the bias voltage output circuit can output the bias voltage based on the adjustment value according to the set value for setting the output clock signal to have an appropriate duty ratio in the test mode.

In the present embodiment, the bias voltage output circuit may include a ladder resistor circuit provided between a high potential side power source node and a low potential side power source node, and a selector configured to select one of a plurality of voltage division taps of the ladder resistor circuit based on the adjustment value.

As a result, by the bias voltage output circuit having a simple configuration, the bias voltage according to the adjustment value from the logic circuit can be output, and the output clock signal having an appropriate duty ratio can be output.

In the present embodiment, the bias voltage output circuit may include a P-type transistor provided between the high potential side power source node and one end of the ladder resistor circuit and having a gate to which the bias voltage is input, and an N-type transistor provided between the other end of the ladder resistor circuit and the low potential side power source node and having a gate to which the bias voltage is input.

As a result, influence of corner variations in a semiconductor manufacturing process can be reduced, and an adjustment width in the ladder resistor circuit may be narrowed.

In the present embodiment, the logic circuit may determine the set value by changing the adjustment value by a binary search.

As a result, the set value of the adjustment value for setting the output clock signal CKQ to have an appropriate duty ratio can be efficiently found by the binary search, and the searched set value can be stored in the storage circuit.

In the present embodiment, the storage circuit may be a non-volatile memory.

As a result, the set value of the adjustment value for setting the output clock signal to have an appropriate duty ratio is stored in the non-volatile memory capable of holding storage of information even when a power source is not supplied.

In the present embodiment, the circuit device may further include a temperature compensation circuit configured to perform temperature compensation on an oscillation frequency of the oscillation signal. The bias voltage output circuit may output the bias voltage of the oscillation signal and output a reference voltage for temperature compensation to the temperature compensation circuit.

As a result, not only the bias voltage but also the reference voltage for temperature compensation can be generated and output by effectively utilizing circuits of the bias voltage output circuit, and thus the circuits can be shared, and the circuit device can be reduced in size.

An oscillator according to the present embodiment includes a resonator and a circuit device configured to generate an oscillation signal by oscillating the resonator. The circuit device includes: an output circuit including a waveform-shaping circuit configured to waveform-shape the oscillation signal, and configured to output an output clock signal based on a clock signal subjected to the waveform-shaping by the waveform-shaping circuit; a bias voltage output circuit configured to output a bias voltage of the oscillation signal input to the waveform-shaping circuit; a comparator configured to compare a DC voltage obtained by smoothing the clock signal subjected to the waveform-shaping with a reference voltage; a logic circuit configured to set an adjustment value of the bias voltage of the bias voltage output circuit; and a storage circuit. In a test mode, the logic circuit changes the adjustment value to determine a set value of the adjustment value based on output of the comparator when the adjustment value is changed, and stores the determined set value in the storage circuit.

As a result, it is possible to provide an oscillator capable of outputting an output clock signal in which an appropriate duty ratio is set and noise deterioration is reduced.

A manufacturing method according to the present embodiment is a manufacturing method of an oscillator that includes a resonator and a circuit device configured to generate an oscillation signal by oscillating the resonator. The circuit device includes: an output circuit including a waveform-shaping circuit configured to waveform-shape the oscillation signal, and configured to output an output clock signal based on a clock signal subjected to the waveform-shaping by the waveform-shaping circuit; a bias voltage output circuit configured to output a bias voltage of the oscillation signal input to the waveform-shaping circuit; a comparator configured to compare a DC voltage obtained by smoothing the clock signal subjected to the waveform-shaping with a reference voltage; and a storage circuit. The manufacturing method according to the present embodiment includes: setting the circuit device to a test mode; changing the adjustment value in the test mode; and searching for, based on output of the comparator when the adjustment value is changed, the adjustment value for setting a duty ratio of the output clock signal to a predetermined duty ratio. The manufacturing method according to the present embodiment further includes: determining the found adjustment value as a set value of the adjustment value; and storing the determined set value in the storage circuit.

As a result, it is possible to manufacture an oscillator capable of outputting the output clock signal in which an appropriate predetermined duty ratio is set and also capable of effectively preventing deterioration in noise characteristics of the output clock signal.

Although the present embodiment has been described in detail above, it will be easily understood by a person skilled in the art that many modifications can be made without substantially departing from the novel matters and effects of the present disclosure. Therefore, all such modifications are intended to be included within the scope of the present disclosure. For example, a term cited with a different term having a broader meaning or the same meaning at least once in the specification or the drawings can be replaced with a different term at any place in the specification or the drawings. In addition, all combinations of the present embodiment and the modifications are also included in the scope of the present disclosure. The configurations, operations, and the like of the circuit device and the oscillator are not limited to those described in the present embodiment, and various modifications can be made.

What is claimed is:

1. A circuit device comprising:
an output circuit including a waveform-shaping circuit configured to waveform-shape an oscillation signal, and configured to output an output clock signal based on a clock signal subjected to the waveform-shaping by the waveform-shaping circuit;
a bias voltage output circuit configured to output a bias voltage of the oscillation signal input to the waveform-shaping circuit;
a comparator configured to compare a DC voltage obtained by smoothing the clock signal subjected to the waveform-shaping with a reference voltage;
a logic circuit configured to set an adjustment value of the bias voltage of the bias voltage output circuit; and
a storage circuit, wherein
in a test mode of the circuit device, the logic circuit changes the adjustment value to determine a set value of the adjustment value based on output of the comparator when the adjustment value is changed, and stores the determined set value in the storage circuit.

2. The circuit device according to claim 1, wherein
in a normal mode of the circuit device, the bias voltage output circuit outputs the bias voltage based on the adjustment value according to the set value stored in the storage circuit.

3. The circuit device according to claim 1, wherein
the bias voltage output circuit includes:
a ladder resistor circuit provided between a high potential side power source node and a low potential side power source node; and
a selector configured to select one of a plurality of voltage division taps of the ladder resistor circuit based on the adjustment value.

4. The circuit device according to claim 3, wherein
the bias voltage output circuit includes:
a P-type transistor provided between the high potential side power source node and one end of the ladder resistor circuit and having a gate to which the bias voltage is input; and
an N-type transistor provided between the other end of the ladder resistor circuit and the low potential side power source node and having a gate to which the bias voltage is input.

5. The circuit device according to claim 1, wherein
the logic circuit is configured to determine the set value by changing the adjustment value by a binary search.

6. The circuit device according to claim 1, wherein
the storage circuit is a non-volatile memory.

7. The circuit device according to claim 1, further comprising:
a temperature compensation circuit configured to perform temperature compensation on an oscillation frequency of the oscillation signal, wherein
the bias voltage output circuit is configured to output the bias voltage of the oscillation signal and output a reference voltage for temperature compensation to the temperature compensation circuit.

8. An oscillator comprising:
a resonator; and
a circuit device configured to generate an oscillation signal by oscillating the resonator, wherein
the circuit device includes:
an output circuit including a waveform-shaping circuit configured to waveform-shape the oscillation signal, and configured to output an output clock signal based on a clock signal subjected to the waveform-shaping by the waveform-shaping circuit;
a bias voltage output circuit configured to output a bias voltage of the oscillation signal input to the waveform-shaping circuit;
a comparator configured to compare a DC voltage obtained by smoothing the clock signal subjected to the waveform-shaping with a reference voltage;
a logic circuit configured to set an adjustment value of the bias voltage of the bias voltage output circuit; and
a storage circuit, wherein
in a test mode of the circuit device, the logic circuit changes the adjustment value to determine a set value of the adjustment value based on output of the comparator when the adjustment value is changed, and stores the determined set value in the storage circuit.

9. A manufacturing method of an oscillator that includes a resonator and a circuit device configured to generate an oscillation signal by oscillating the resonator,
the circuit device including:
an output circuit including a waveform-shaping circuit configured to waveform-shape the oscillation signal, and configured to output an output clock signal based on a clock signal subjected to the waveform-shaping by the waveform-shaping circuit;
a bias voltage output circuit configured to output a bias voltage of the oscillation signal input to the waveform-shaping circuit;
a comparator configured to compare a DC voltage obtained by smoothing the clock signal subjected to the waveform-shaping with a reference voltage; and
a storage circuit,
the manufacturing method comprising:
setting the circuit device to a test mode;
changing the adjustment value in the test mode;
searching for, based on output of the comparator when the adjustment value is changed, the adjustment value for setting a duty ratio of the output clock signal to a predetermined duty ratio;
determining the found adjustment value as a set value of the adjustment value; and
storing the determined set value in the storage circuit.

* * * * *